(12) United States Patent
Tsao et al.

(10) Patent No.: US 10,889,097 B2
(45) Date of Patent: *Jan. 12, 2021

(54) WAFER DEBONDING SYSTEM AND METHOD

(71) Applicant: Taiwan Semiconductor Manufacturing Co., Ltd., Hsin-Chu (TW)

(72) Inventors: Chang-Chen Tsao, Tainan (TW); Kuo Liang Lu, Hsinchu (TW); Ru-Liang Lee, Hsinchu (TW); Sheng-Hsiang Chuang, Hsin-Chu (TW); Yu-Hung Cheng, Tainan (TW); Yeur-Luen Tu, Taichung (TW); Cheng-Kang Hu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,348

(22) Filed: Dec. 11, 2019

(65) Prior Publication Data

US 2020/0108592 A1  Apr. 9, 2020

Related U.S. Application Data

(60) Continuation of application No. 16/220,163, filed on Dec. 14, 2018, now Pat. No. 10,569,520, which is a
(Continued)

(51) Int. Cl.
*B32B 38/10* (2006.01)
*H01L 21/67* (2006.01)
(Continued)

(52) U.S. Cl.
CPC ........ *B32B 38/10* (2013.01); *H01L 21/67011* (2013.01); *H01L 21/67092* (2013.01);
(Continued)

(58) Field of Classification Search
CPC .................................................. H01L 21/67011
See application file for complete search history.

(56) References Cited

U.S. PATENT DOCUMENTS 10,569,520 B2 * 2/2020 Tsao ........................ B32B 38/10
2011/0253315 A1  10/2011 George
(Continued)

OTHER PUBLICATIONS

Notice of Allowance dated Oct. 4, 2018 for U.S. Appl. No. 15/613,963.
(Continued)

*Primary Examiner* — Zandra V Smith
*Assistant Examiner* — Andre C Stevenson
(74) *Attorney, Agent, or Firm* — Eschweiler & Potashnik, LLC (57) ABSTRACT

The present disclosure relates to a debonding apparatus. In some embodiments, the debonding apparatus comprises a wafer chuck configured to hold a pair of bonded substrates on a chuck top surface. The debonding apparatus further comprises a pair of separating blades including a first separating blade and a second separating blade placed at edges of the pair of bonded substrates. The first separating blade has a first thickness that is smaller than a second thickness of the second separating blade. The debonding apparatus further comprises a flex wafer assembly configured to pull the pair of bonded substrates upwardly to separate a second substrate from a first substrate of the pair of bonded substrate. By providing unbalanced initial torques on opposite sides of the bonded substrate pair, edge defects and wafer breakage are reduced.

20 Claims, 5 Drawing Sheets

Related U.S. Application Data division of application No. 15/613,963, filed on Jun. 5, 2017, now Pat. No. 10,155,369.

(60) Provisional application No. 62/427,208, filed on Nov. 29, 2016.

(51) Int. Cl.
*H01L 21/68* (2006.01)
*H01L 21/683* (2006.01)

(52) U.S. Cl.
CPC ........ *H01L 21/681* (2013.01); *H01L 21/6835* (2013.01); *H01L 21/6838* (2013.01)

(56) References Cited

U.S. PATENT DOCUMENTS

| | | |
|---|---|---|
| 2013/0075739 A1 | 3/2013 | Loy et al. |
| 2015/0231790 A1* | 8/2015 | Landru .................... B26D 3/28 156/762 |
| 2016/0329235 A1* | 11/2016 | Fehkuhrer ......... H01L 21/68728 |

OTHER PUBLICATIONS

Notice of Allowance dated Nov. 15, 2019 for U.S. Appl. No. 16/220,163.

* cited by examiner

WAFER DEBONDING SYSTEM AND METHOD

REFERENCE TO RELATED APPLICATIONS

This Application is a Continuation of U.S. application Ser. No. 16/220,163, filed on Dec. 14, 2018, which is a Divisional of U.S. application Ser. No. 15/613,963, filed on Jun. 5, 2017 (now U.S. Pat. No. 10,155,369, issued on Dec. 18, 2018), which claims the benefit of U.S. Provisional Application No. 62/427,208, filed on Nov. 29, 2016. The contents of the above-referenced Patent Applications are hereby incorporated by reference in their entirety.

BACKGROUND

Integrated chips are fabricated through a plurality of processing steps (e.g., etching steps, lithography steps, deposition steps, etc.) upon a semiconductor wafer (e.g., a silicon wafer), followed by dicing the semiconductor wafer into separate integrated chips. In order to realize higher integration, simplify packaging processes, or couple circuits or other components, etc., in some cases two or more wafers are bonded together before the dicing step, and circuits are fabricated on both sides of the wafer after thin down. Wafer level bonding is a promising technology for "More than Moore", where added value is provided to devices by incorporating functionality that does not necessarily scale according to Moore's Law. Debonding is desired in some cases during the wafer level bonding procedure, and can be used for example to separate one wafer from another, and can be used to rework a substrate when alignment is out of spec or particulates that fall onto a wafer cause interface voids, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

There are different kinds of debonding approaches: such as single side debonding and double sides debonding. A single side debonding needs a lower debonding force F1 because of a higher torque with a longer lever arm to wafer connecting point but has a high risk to induce defects near wafer edges at the opposite side of debonding start point. A double side debonding has a low risk to induce defects near wafer edges, but needs higher pull forces F2 and has a high wafer breakage risk because of the large wafer bending strength when initiating the debonding process.

The present disclosure relates to improving apparatus and methods for wafer debonding to reduce edge defects and wafer breakage, and also to reduce debonding pull forces needed. In some embodiments, referring to FIG. 1 for example, a debonding apparatus 100 for debonding a pair of bonded wafers 102a, 102b comprises a wafer chuck 104 configured to hold a first wafer 102a of the pair of bonded wafers in contact with a chuck top surface. A pair of separating blades includes a first separating blade 106a and a second separating blade 106b that are configured to be placed at edges of the pair of bonded wafers diametrically opposite to each other. A flex wafer assembly 108 includes a first pulling head 110a and a second pulling head 110b diametrically opposite to the first pulling head. The first pulling head 110a and the second pulling head 110b are configured to be placed above the pair of bonded wafers and to provide pull forces to hold and move a second wafer 102b of the pair of bonded wafers separated from the first wafer 102a. By providing the two separating blades 106a, 106b with different thicknesses, and/or providing different pull forces through the pulling heads 110a, 110b, initial vertical separating heights between the bonded wafers are different. Thereby bending of the wafer is reduced when initiating the debonding process, which reduces a possibility of wafer breakage (compared to inserting two separating blades with the same thickness and providing the same pulling force through pulling heads).

Figure 1:
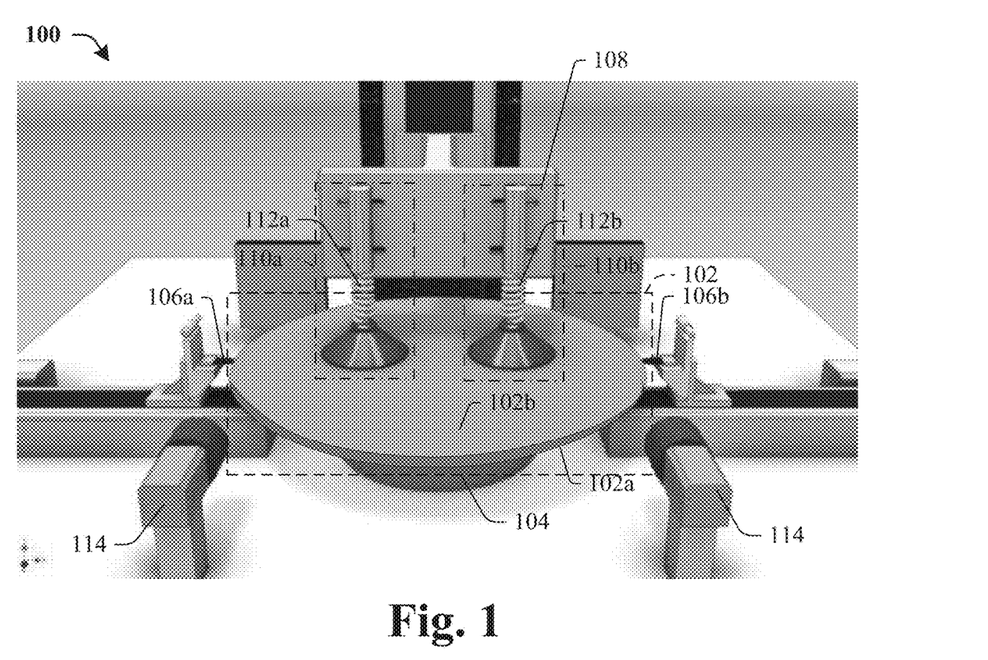
FIG. 1 illustrates a perspective view of a wafer debonding system for debonding a pair of bonded wafers according to some embodiments.

FIG. 1 illustrates a perspective view of a wafer debonding system 100 for debonding a pair of bonded wafers according to some embodiments. As shown in FIG. 1, a wafer chuck 104 is provided. The wafer chuck 104 can be a component of a chuck assembly used for holding wafers in place with a fixture that utilizes a vacuum chuck or some other means of mechanical, electrical, or magnetic attachment. A pair of wafers 102 can be placed on the wafer chuck with a first wafer 102a in contact with a chuck top surface. A second wafer 102b is bonded face-to-face to the first wafer 102a through various bonding techniques including direct bonding and indirect bonding, such as silicon fusion bonding, oxide bonding, hybrid bonding, or adhesive bonding using an adhesive layer between the first wafer 102a and the second wafer 102b. A flex wafer assembly 108 is configured to be placed on the top surface of the wafer chuck 104 to hold a wafer and provide pull forces. The flex wafer assembly 108 may be controlled by a programmable drive motor and is configured to hold and move the second wafer 102b of the pair of bonded wafers separated from the first wafer 102a. The flex wafer assembly 108 may comprise at least two pulling heads, a first pulling head 110a and a second pulling head 110b that are placed diametrically opposite to each other about a central axis of the wafer chuck (and/or about a central axis of the pair of bonded wafers). The pulling heads 110a, 110b may be utilized to apply pull forces to the second wafer 102b and to separate and remove the second wafer 102b from the first wafer 102a. The pulling heads 110a, 110b are movable in a direction perpendicular to the wafer surface plane and have adjustable top vacuum cup positions, for example, about 3 cm to about 9 cm above the top surface of the bonded wafer pair 102, depending on applications. In some embodiments, different pull forces may be applied by the pulling heads 110a, 110b in order to create a greater initial pull force on one side of the pair of bonded wafers 102a, 102b and a smaller initial pull force on the other side of the pair of bonded wafers 102a, 102b to provide unbalanced initial torques. The greater initial pull force on the pulling head 110b results in a debonding propagation wave propagating quickly to enlarge the debonding torque. The smaller initial pull force on the pulling head 110a pulls up the lower side the bonded wafer pair 102 to prevent scratches at wafer edges. One vacuum system may be shared by the first pulling head 110a and the second pulling head 110b to apply pull forces. A pair of coil springs 112a, 112b may respectively be attached to the pulling heads 110a, 110b to control the pull forces. In some embodiments, the coil springs 112a, 112b may have different spring coefficients, such that a first pull force applied by the first pulling head 110a is smaller than a second pull force applied by the second pulling head 110b. In some embodiments, the spring coefficients of the coil springs 112a, 112b can be in a range of from about $1 \times 10^2$ N/m to about $1 \times 10^5$ N/m. In some embodiments, the spring coefficient of the second coil spring 112b can be 10 to 100 times greater than the spring coefficient of the first coil spring 112a to provide sufficient pulling force differences. In this way, the pull forces introduced by the first and second pulling heads 110a, 110b can be sufficiently unbalanced to provide unbalanced initial torques on opposite sides of the pair of bonded wafers 102a, 102b, thereby enhancing the debonding process.

A pair of separating blades is placed at edges of the pair of bonded wafers 102 diametrically opposite to each other. The pair of separating blades includes a first separating blade 106a and a second separating blade 106b that are configured to be inserted into a bonding interface of the first wafer 102a and the second wafer 102b from edges to facilitate the debonding of the first wafer 102a and the second wafer 102b. In some embodiments, the first separating blade 106a has a first thickness that is smaller than a second thickness of the second separating blade 106b. In some additional embodiments, more than two separating blades can be provided and distributed evenly along outer edges of the pair of bonded wafers 102 to separate the pair of bonded wafers 102 to further reduce edge defects. In some further embodiments, a monitoring assembly 114, including sensing devices such as a pair of three-dimensional cameras or charge-coupled device cameras, is included in the wafer debonding system 100, to check the debonding processes and provide information for further adjustment of the separating blades 106a, 106b. For example, in some embodiments, the monitoring assembly 114 detects separate distance of the first wafer 102a and the second wafer 102b by taking pictures and processing the taken pictures. The monitoring assembly may also help to determine how much further the separating blades 106a, 106b ought to be inserted between the first wafer 102a and the second wafer 102b, or whether to increase or decrease the pulling forces applied by the pulling heads 110a, 110b. In some embodiments, the pulling heads 110a, 110b continuously assert the first and second pulling forces as the first and second separating blades 106a, 106b are slidably inserted between the first and second wafers 102a, 102b by an increasing amount until the monitoring assembly 114 detects that the first and second wafers 102a, 102b have been de-bonded on at least one edge (and/or on both edges). As an example, a vertical distance of at least one edge between the first wafer 102a and the second wafer 102b is extracted by measuring the taken pictures of the monitoring assembly 114. The extracted vertical distance is then compared to a vertical dimension of at least one of the inserted blades 106a, 106b to determine the de-boned condition: if the vertical distance between wafers is greater than the vertical dimension of the inserted blade, the wafers are considered as de-bonded at that edge. In some alternative embodiments, the de-boned condition is determined by a pull target distance. For example, the wafers are considered as de-bonded when the pulling heads 110a, 110b (and the second wafer 102b that is sucked by the vacuum inside the pulling heads) move up a distance greater than 15 mm. In some further embodiments, a force sensor is attached to the pulling heads 110a, 110b to help to determine the de-bonded condition. For example, the wafers are considered as de-bonded when the force sensor detects a zero value of the pulling forces. One or more of above approaches may be adopted to help determine or confirm the de-boned condition. When this de-bonded condition of the first and second wafers is detected, the first and second separating blades 106a, 106b can be retracted, and the first and second wafers, now de-bonded (separated) from each other, can be removed from the chuck, and another pair of bonded wafers can be placed on the chuck for de-bonding. It is understood that though a pair of bonded wafers, the first wafer 102a and the second wafer 102b, is described above and will continue to be described below for understanding how the wafer debonding system 100 works, the workpiece of the wafer debonding system 100 includes any suitable substrates for the fabrication of integrated circuits, such as thin slices of semiconductor material (such as a crystalline silicon, or a binary compound (e.g., GaAs wafer), a ternary compound substrate (e.g., AlGaAs), or higher order compound, etc.), or non-semiconductor materials such as oxide in silicon-on-insulator (SOI), partial SOI, polysilicon, amorphous silicon, or organic materials, among others. Such substrates can have varies devices or structures fabricated or bonded thereon.

Figure 2A:
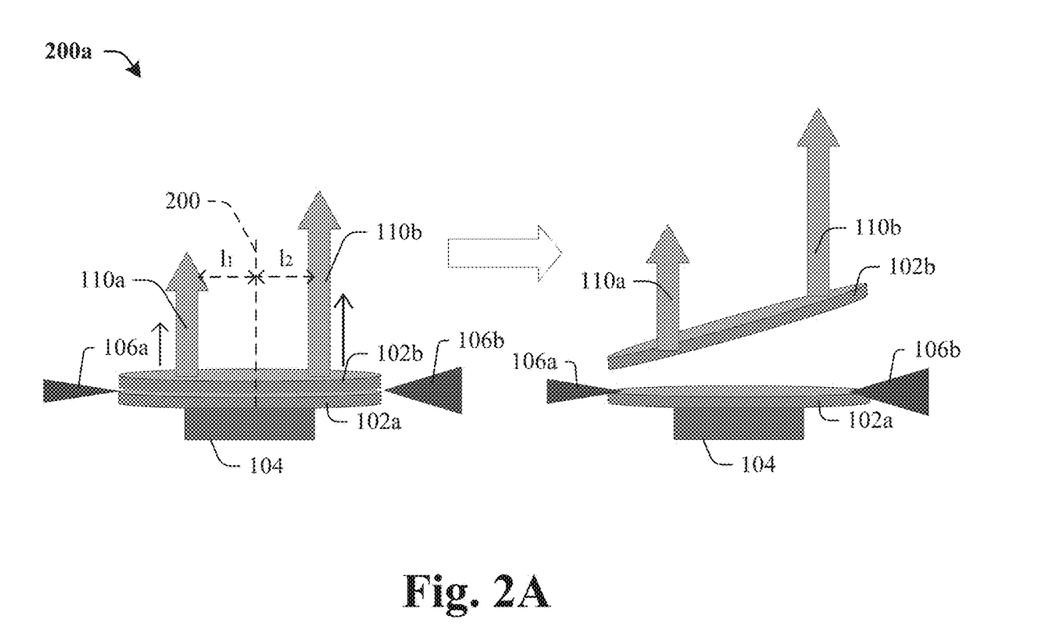
FIG. 2A illustrates a schematic diagram of a wafer debonding method for debonding a pair of bonded wafers using a pair of separating blades with different thicknesses and a pair of pulling heads with different pull forces according to some embodiments.

FIG. 2A illustrates a schematic diagram of a wafer debonding method for debonding a pair of bonded wafers according to some embodiments. As shown in FIG. 2A, a pair of bonded wafers 102a, 102b can be separated by using a pair of separating blades 106a, 106b having different thicknesses and inserted therebetween from edges of the pair of bonded wafers 102a, 102b, and/or by using a pair of pulling heads 110a, 110b configured to provide different pulling forces and placed above the bonded wafers 102a, 102b to pull away one of the bonded wafers 102b while fixing the other of the bonded wafers 102a on the wafer chuck 104. In some embodiments, the pair of separating blades 106a, 106b is arranged diametrically opposite to each other. The pair of pulling heads 110a, 110b can also be arranged diametrically opposite to each other. A first pull point distance 11 from the first pulling head 110a to a central axis or center point 200 of the pair of bonded wafers 102a, 102b can be equal to a second pull point distance 12 from the pulling head 110b to the center point 200 of the pair of bonded wafers 102a, 102b. The pair of pulling heads 110a, 110b can be placed on top surfaces of the second wafer 102b around places that are within edges of the wafer chuck 104 for initial ducking of pulling heads 110a, 110b on the second wafer 102b. In some further embodiments, the placement of the pair of pulling heads 110a, 110b can be adjusted for various applications, in order to improve the debonding quality. The adjustment may be based on the information provided by the monitoring assembly 114 disclosed in FIG. 1. For example, the pair of pulling heads 110a, 110b can be placed between the edges of wafers 102a, 102b and the wafer chuck 104. The location of the pair of pulling heads 110a, 110b is tunable closer or away from the center point 200 of the pair of bonded wafers 102a, 102b. The monitoring assembly 114 may check the debonding processes and provide information for further adjustment of the location of the pair of pulling heads 110a, 110b and the pulling forces applied by the pulling heads 110a, 110b. In some embodiments, the pulling heads 110a, 110b continuously assert the first and second pulling forces as the first and second separating blades 106a, 106b are slidably inserted between the first and second wafers 102a, 102b by an increasing or decreasing amount until the monitoring assembly 114 detects that the first and second wafers 102a, 102b have been de-bonded on at least one edge (and/or on both edges).

Figure 2B:
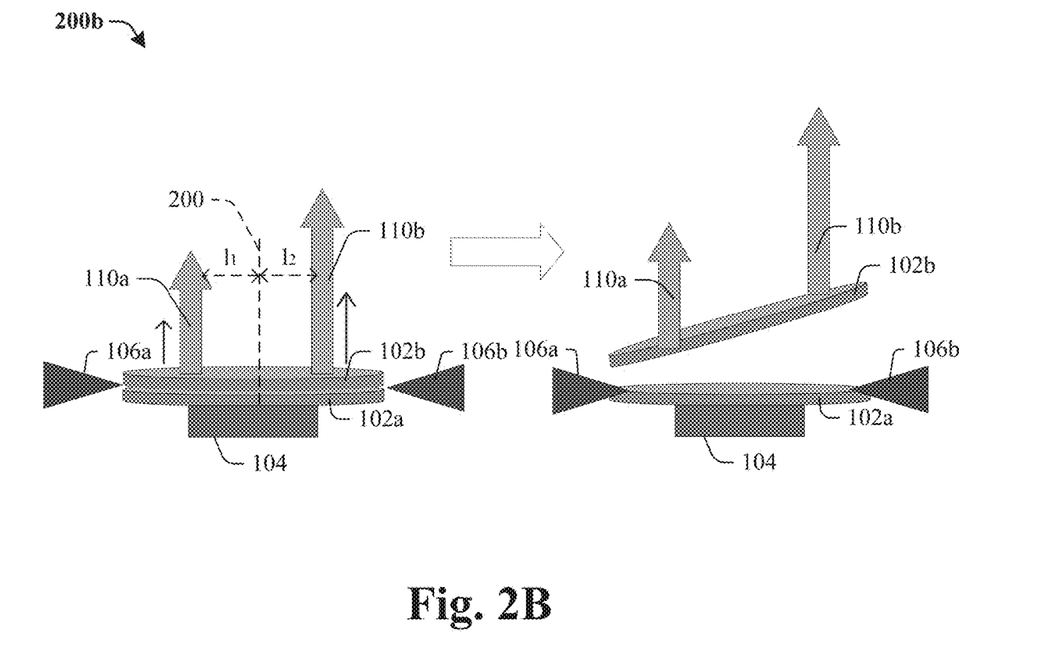
FIG. 2B illustrates a schematic diagram of a wafer debonding method for debonding a pair of bonded wafers using a pair of pulling heads with different pull forces according to some alternative embodiments.
Figure 2C:
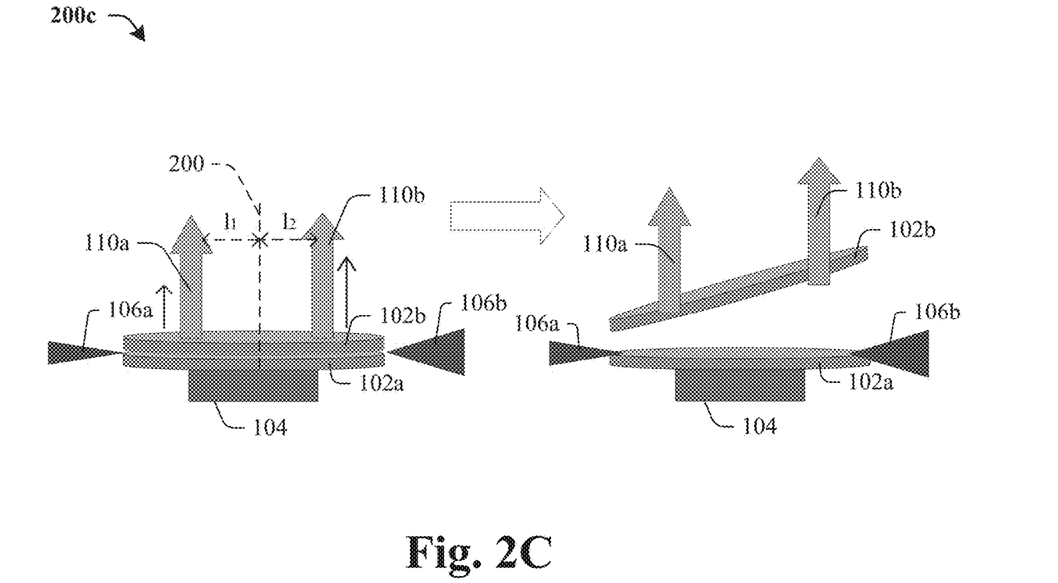
FIG. 2C illustrates a schematic diagram of a wafer debonding method for debonding a pair of bonded wafers using a pair of separating blades with different thicknesses according to some alternative embodiments.

FIG. 2B and FIG. 2C illustrate alternative embodiments of schematic diagrams of a wafer debonding method of FIG. 2A. As shown in FIG. 2B, a pair of bonded wafers 102a, 102b can be separated by using a pair of pulling heads 110a, 110b placed above the bonded wafers 102a, 102b with different pull forces and a pair of separating blades 106a, 106b inserted therebetween from edges of the pair of bonded wafers 102a, 102b with the same thickness. As shown in FIG. 2C, a pair of bonded wafers 102a, 102b can be separated by using a pair of separating blades 106a, 106b inserted therebetween from edges of the pair of bonded wafers 102a, 102b with different thicknesses and a pair of pulling heads 110a, 110b placed above the bonded wafers 102a, 102b with the pull force. Other features of FIG. 2B and FIG. 2C are similar to FIG. 2A and can be referred above.

Figure 3:
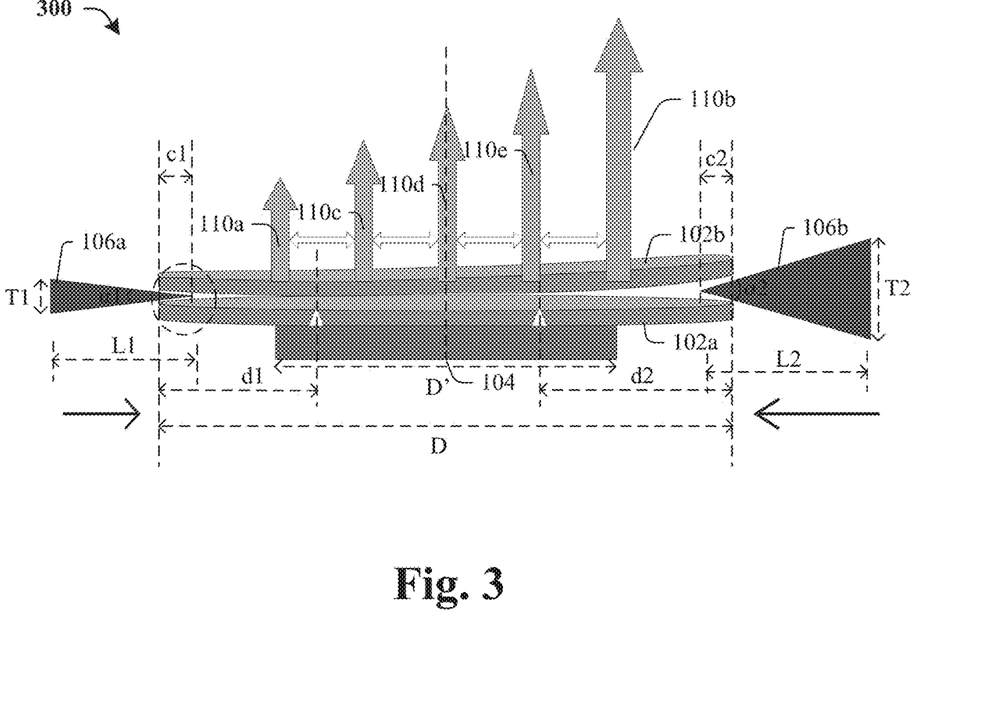
FIG. 3 illustrates a schematic diagram of a wafer debonding method for debonding a pair of bonded wafers using a pair of separating blades with different thicknesses according to some embodiments.

FIG. 3 illustrates a schematic diagram of a wafer debonding method 300 for debonding a pair of bonded wafers using a pair of separating blades with different thicknesses according to some embodiments. Some dimensions of the wafer debonding method of FIG. 2A are further illustrated in FIG. 3. As shown in FIG. 3, the first separating blade 106a has a first length L1, a first thickness T1, and is inserted between the first wafer 102a and second wafer 102b to a first distance c1 during a debonding process. The second separating blade 106b has a second length L2, a second thickness T2, and is inserted between the first wafer 102a and second wafer 102b to a second distance c2 during the same debonding process. The second distance c2 may be equal to the first distance c1. The second thickness T2 may be greater than (1.2 to 3 times greater preferably) to the first thickness T1. The first separating blade 106a has a first pointed end with a first flare angle $\alpha 1$ and the second separating blade 106b has a second pointed end with a second flare angle $\alpha 2$. The second flare angle $\alpha 2$ is equal or greater than the first flare angle $\alpha 1$. By providing the two separating blades 106a, 106b with different flare angles, different distances of separation between the wafers are generated when inserting the two separating blades into an interface of the bonded wafers. Thereby a larger initial torque is provided on one side of the pair of bonded wafer 102a, 102b to enhance debonding wave propagation and reduce debonding force, and a smaller wafer bending is introduced on the other side of the pair of bonded wafers 102a, 102b to reduce the possibility of wafer breakage but still pulling up the wafer edges to prevent scratches or other edge defects.

The pair of bonded wafers 102a, 102b has a maximum diameter D, and is placed on the wafer chuck 104 and is concentric to the wafer chuck 104 during the debonding process. The wafer chuck 104 has a diameter D' (or greatest lateral dimension if not a round shape) smaller than the maximum diameter D of the pair of bonded wafers 102a, 102b. In some preferred embodiments, the diameter D' of the wafer chuck 104 can be about 0.5 to about 0.9 times of the maximum diameter D of the pair of bonded wafers 102a, 102b, such that the pair of bonded wafers 102a, 102b has desired spaces (free-standing area) to perform the debonding process and also has desired back support from the wafer chuck 104. For example, the pair of bonded wafers 102a, 102b can be 12-inch (i.e. 300 mm) wafers before dicing and packaging, and the wafer chuck 104 is preferred to have the diameter D' in a range of from about 150 mm (millimeter) to about 250 mm. Correspondingly, the first thickness T1 of the first separating blade 106a can be in a range of from about 2 mm to about 6 mm, and the second thickness T2 of the second separating blade 106b can be also in a range of from about 2 mm to about 6 mm, but greater than the first thickness T1. A ratio of the first thickness to the second thickness T1:T2 can be in a range of about 1:1.2 to 1:3. In some embodiments, the lengths L1, L2 are equal. The first distance c1 inserted by the first separating blade 106a and the second distance c2 inserted by the second separating blade 106b can respectively be in a range of from about 8 mm to about 12 mm. The pair of pulling heads 110a, 110b is arranged diametrically opposite to each other. In some further embodiments, some more pulling heads, such as 110c, 110d, and 110e can also be placed on top surfaces of the second wafer 102b for pulling up the second wafer 102b.

The multiple pulling heads are distributed in a certain pattern. For example, the multiple pulling heads can be arranged in a linear line that passes through the central axis of the second wafer 102b and/or evenly spaced one from another, and the pulling forces provided by the multiple pulling heads can be linearly or parabolic increased, in order to collectively provide enhanced pulling forces. Using the setups disclosed above, initial debonding lengths of two sides of the pair of bonded wafers 102a, 102b are unbalanced, i.e., a first initial debonding length d1 introduced by the first separating blade 106a and corresponding pulling forces is smaller than a second initial debonding length d2 introduced by the second separating blade 106b and corresponding pulling forces. Comparing to the single side debonding method, the debonding methods disclosed above are less likely to introduce wafer edge defects. Compared to the balanced double side debonding method, the new debonding methods disclosed above need smaller pull forces, and are also less likely to cause wafer breakage.

Figure 4A:
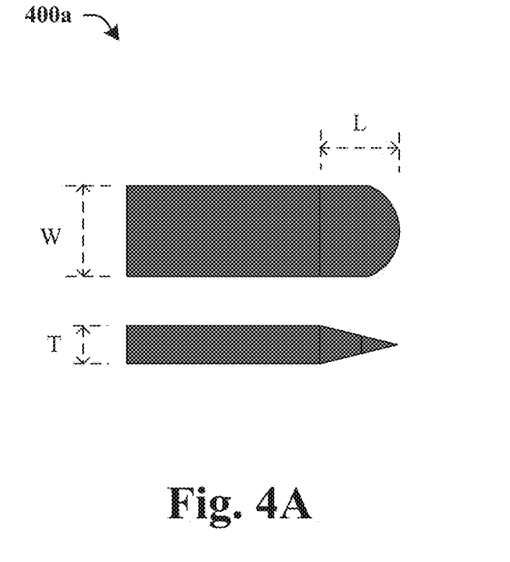
FIG. 4A illustrates cross-sectional and top views of a separating blade of a wafer debonding system shown in FIG. 1, 2, or 3 according to some embodiments.
Figure 4B:
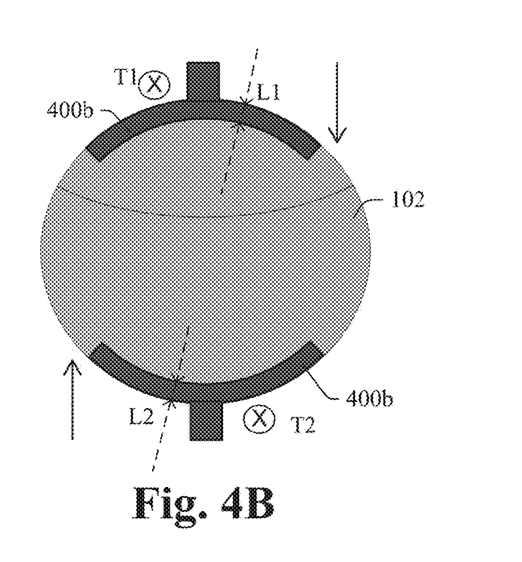
FIG. 4B illustrates cross-sectional and top views of a separating blade of a wafer debonding system shown in FIG. 1, 2, or 3 according to some alternative embodiments.

FIG. 4A illustrates cross-sectional and top views of a separating blade 400a of a wafer debonding system shown in FIG. 1, FIG. 2, or FIG. 3 according to some embodiments. It is appreciated that the separating blade 400a can be the first separating blade 106a and the second separating blade 106b shown in FIG. 1, FIG. 2, or FIG. 3. The separating blade 400a may have a rounded front wedge as shown in the top view located at an upper portion of FIG. 4 to reduce scratch risk. The separating blade 400a may have a pointed end as shown in the cross-sectional view located at a lower portion of FIG. 4. As an example, the separating blade 400a can be designed to have a width W in a range of from about 6 mm to about 14 mm, a thickness T in a range of from about 2 mm to about 6 mm, and a pointed end length L in a range of from about 6 mm to about 14 mm. The separating blade 400a can be made of a material with a small hardness to reduce scratch risk, and a high Young's modulus to create initial bonding area. The scratch hardness of the separating blade 400a can be smaller than that of the material of wafers to be processed (e.g. wafers 102a, 102b in FIG. 3). The scratch hardness of the separating blade 400a can be smaller than about 5 gigapascals (GPa) when the wafers to be processed is made of silicon, and Young's modulus of the separating blade 400a can be greater than about 3 gigapascals (GPa). For example, the separating blade 400a can be made of polyetheretherketone (PEEK) with a scratch hardness in a range of from about 0.05 GPa to about 0.3 GPa, and a Young's modulus in a range of from about 3.76 GPa to 3.95 GPa, or other materials with such requirements of Young's modulus and hardness in some embodiments. FIG. 4B illustrates a top view of a separating blade 400b of a wafer debonding system shown in FIG. 1, FIG. 2 or FIG. 3 according to some alternative embodiments. As an alternative option of the rounded front wedge of the separating blade 400a of FIG. 4A, the separating blade 400b may have a quarter-circular wedge corresponding to a wafer edge of a bonded wafer pair 102. The separating blade 400b may be respectively placed at opposite sides of the wafers to be processed matching the circumferences of the wafers and corresponding to the separating blades 106a, 106b of FIG. 1, FIG. 2 or FIG. 3, and may have inserted length L1, L2 and thicknesses T1 and T2 (T1, T2 are in the direction perpendicular to the top view plane shown in FIG. 4B). The inserted length L1, L2 and the thicknesses T1 and T2 may have similar relationships and ranges as described in FIG. 3. The debonding area is enlarged (as shown by dashed line) by using the separating blade 400b, and the crack risk is thereby reduced.

FIGS. 5-11 illustrate a series of cross-sectional views of an application to form a three-dimensional integrated circuit using a wafer debonding system for debonding a pair of bonded wafers according to some embodiments according to some embodiments.

Figure 5:
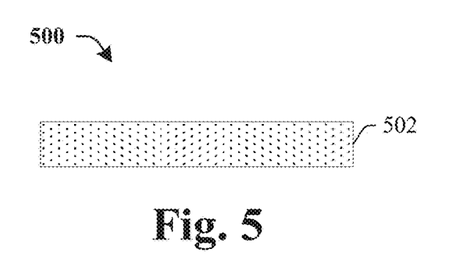
FIGS. 5-11 illustrate a series of cross-sectional views of an application a wafer debonding system for debonding a pair of bonded wafers according to some embodiments according to some embodiments.

As shown in cross-sectional view 500 of FIG. 5, a first wafer 502 is prepared. In some embodiments, the first wafer 502 comprises a silicon substrate. In other embodiments, the first wafer 502 comprises a substrate including germanium, gallium arsenic, or other suitable semiconductor material. The first wafer 502 may be a device wafer and processed to form features, such as circuits, connecting layers, contacts and other applicable structures. Though not shown in FIG. 5, in some embodiments, an adhesive layer can be formed on the first wafer 502 to facilitate a bonding process to be performed. The adhesive layer can be a spin-on adhesive or an alternative adhesive layer, such as a laminated tape, wax, or other suitable material can be used.

Figure 6:
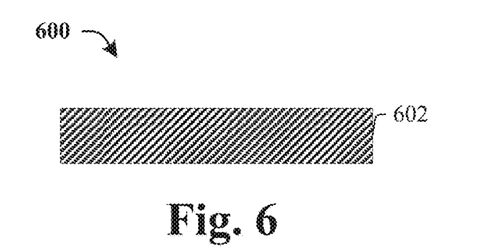

As shown in cross-sectional view 600 of FIG. 6, a second wafer 602 is prepared. In some embodiments, the second wafer 602 can be device wafer. The second wafer 602 may comprise a silicon substrate or other semiconductor substrate similar to the first wafer 502. In some other embodiments, the second wafer 602 can be a carrier wafer, and comprise a sapphire substrate, or a substrate made of thermoplastic polymer, oxide, carbide, or other suitable material. In some embodiments, an adhesion promoter layer (not shown) may be spun on the second wafer 602 to facilitate the bonding with the first wafer 502 of FIG. 5 in a subsequent step.

Figure 7:
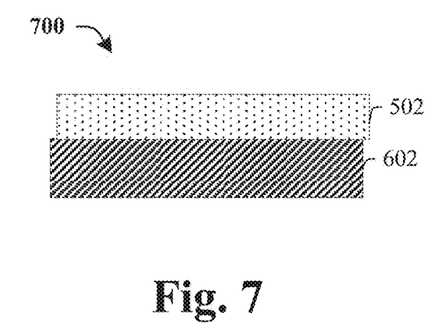
Figure 8:
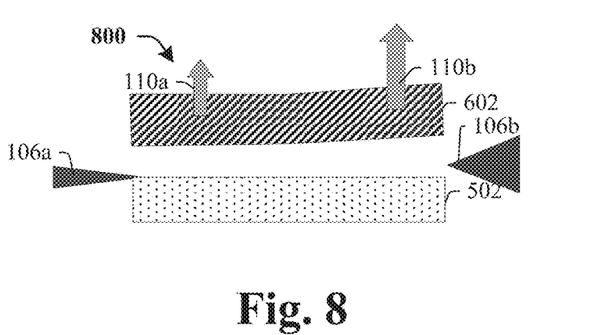

As shown in cross-sectional view 700 of FIG. 7, the second wafer 602 is bonded to the first wafer 502 to form a bonded wafer pair. The second wafer 602 and the first wafer 502 may be bonded through direct or indirect bonding techniques, such as a fusion silicon bonding process, an oxide bonding process, a hybrid bonding process, through the adhesive layer 504, or other applicable techniques. A thermal and/or cure process may be performed to facilitate the bonding process. In some cases, the bonding process may be imperfect: a misalignment may occur where the first wafer 502 and the second wafer 602 are shifted from each other when bonded, some impurity particles or voids may be formed at the bonding interface, among other imperfection bonding occasions. After the bonding process, a wafer bonding condition is determined by a monitoring or measurement process, such as generating and processing bonding condition images taken by a monitoring system (e.g. the monitoring assembly 114 shown in FIG. 1) or some measurement to check electrical connections between the first wafer 502 and the second wafer 602. The methods of the present invention may be implemented in association with various types of monitoring or measurement components and systems, and any such system or group of components, either hardware and/or software, incorporating such a method is contemplated as falling within the scope of the present invention. The monitoring process, for example, can be realized by applying a pad probe or optical scan over the wafer surface. In some embodiments, the bonding alignment and interface voids conditions are detected. It may be determined that whether the misalignment and/or the interface voids are in the desired regions. A decision is then made accordingly regarding whether a debonding process shown in FIG. 8 is needed. Such a decision can be made manually or using a pre-set computer program.

As shown in cross-sectional view 800 of FIG. 8, if the decision is made that a debonding process is needed, the second wafer 602 is then debonded and separated from the first wafer 502. The debonding process can be performed using the debonding system and methods disclosed in this application. A pair of separating blades 106a, 106b with different thicknesses or flare angles and/or a pair of pulling heads 110a, 110b with different pull forces can be utilized to facilitate the debonding process with fewer edge defects and/or reduced wafer breakage.

Figure 9:
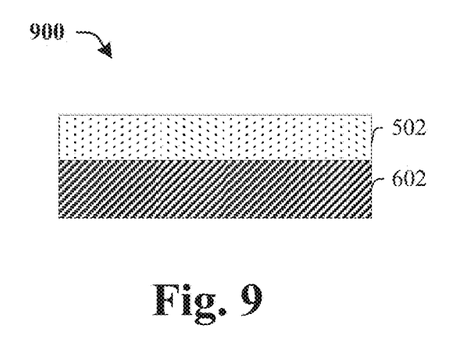

As shown in cross-sectional view 900 of FIG. 9, if the debonding process is performed as shown in FIG. 8, the second wafer 602 is re-bonded to the first wafer 502 similar to the process shown in FIG. 7. In some embodiments, the debonded first wafer 502 and second wafer 602 are inspected for surface defects before the re-bonding process. According to the inspection result, the first wafer 502 and the second wafer 602 may be replaced, cleaned, or re-polished to prepare for the re-bonding process. Then, a wafer bonding condition determination process, and following debonding and re-bonding process similar as described above for FIG. 7 and FIG. 8 may be repeated.

Figure 10:
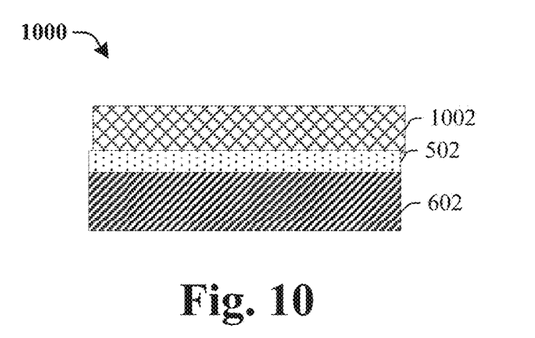

As shown in cross-sectional view 1000 of FIG. 10, additional processes, such as thinning, planarizing, forming circuit features, and any other processing steps can be performed to the first wafer 502 or the second wafer 602. In some embodiments, a third wafer 1002 can be bonded to the bonded wafer pair of the first wafer 502 and the second wafer 602. Then, a wafer bonding condition determination process, and following debonding and re-bonding process similar as described above for FIG. 7 and FIG. 8 may be repeated.

Figure 11:
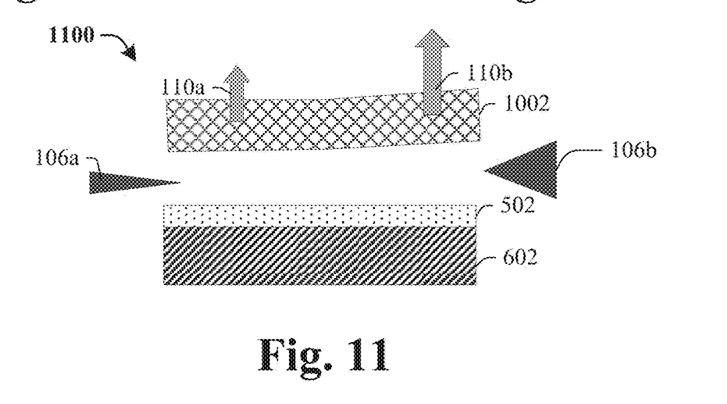

As shown in cross-sectional view 1100 of FIG. 11, the wafer stack of the first wafer 502, the second wafer 602, and the third wafer 1002 are debonded if the decision is made that a debonding process is needed. The debonding process can be performed using the debonding system and methods disclosed in this application. A pair of separating blades 106a, 106b with different thicknesses or flare angles and/or a pair of pulling heads 110a, 110b with different pull forces can be utilized to facilitate the debonding process with fewer edge defects and/or reduced wafer breakage.

Figure 12:
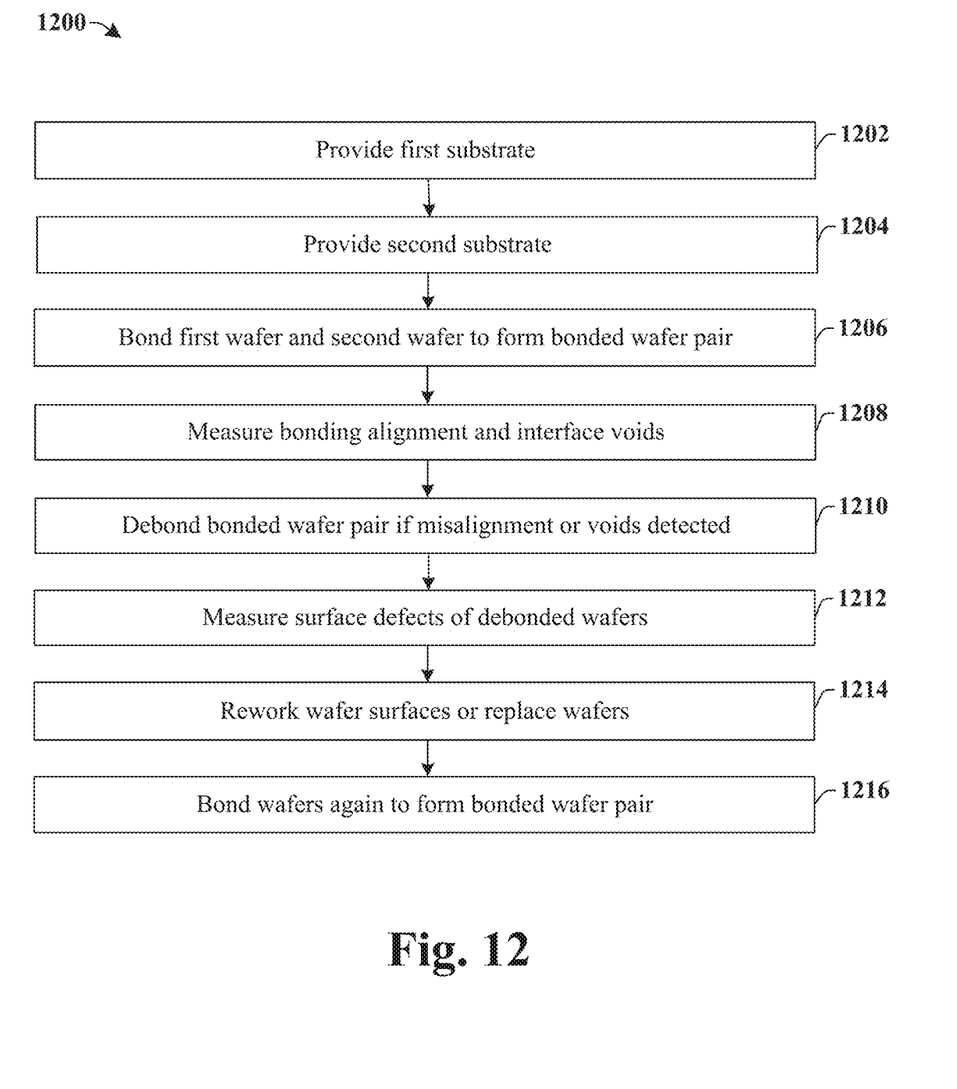
FIG. 12 illustrates a flow diagram of a wafer debonding method for debonding a pair of bonded wafers according to some embodiments.

FIG. 12 shows some embodiments of a flow diagram of a wafer debonding method for debonding a pair of bonded wafers according to some embodiments. Although method 1200 is described in relation to FIGS. 5-11, it will be appreciated that the method 1200 is not limited to such structures disclosed in FIGS. 5-11, but instead may stand alone independent of the structures disclosed in FIGS. 5-11. Similarly, it will be appreciated that the structures disclosed in FIGS. 5-11 are not limited to the method 1200, but instead may stand alone as structures independent of the method 1200. Also, while disclosed methods (e.g., method 1200) are illustrated and described below as a series of operations or events, it will be appreciated that the illustrated ordering of such operations or events is not to be interpreted in a limiting sense. For example, some operations may occur in different orders and/or concurrently with other operations or events apart from those illustrated and/or described herein. In addition, not all illustrated operations may be required to implement one or more aspects or embodiments of the description herein. Further, one or more of the operations depicted herein may be carried out in one or more separate operations and/or phases.

At operation 1202, a first wafer is prepared. In some embodiments, the first wafer is a device wafer. A front side of the first wafer may be processed to form features, such as circuits, connecting layers, contacts, and other applicable structures. FIG. 5 illustrates some embodiments of a cross-sectional view 500 corresponding to operation 1202.

At operation 1204, a second wafer is prepared. The second wafer is another device wafer or a carrier wafer that is used to support the first wafer during subsequent processes. The second wafer may include a substrate made of semiconductor, sapphire, thermoplastic polymer, oxide, carbide, or other suitable material. FIG. 6 illustrates some embodiments of a cross-sectional view 600 corresponding to operation 1204.

At operation 1206, the second wafer is bonded to the first wafer to form a bonded wafer pair. The second wafer and the first wafer may be bonded through a fusion bonding process, through an adhesive layer, or other applicable techniques. A thermal and/or cure process may be performed to facilitate the bonding process. At operation 1208, a wafer bonding condition is determined by a monitoring or measurement process. In some embodiments, it is determined that whether a misalignment and/or interface voids between the first and second wafers are in the desired regions. A decision is then made accordingly regarding whether a debonding process is needed. Such a decision can be made manually or using a pre-set computer program. FIG. 7 illustrates some embodiments of a cross-sectional view 700 corresponding to operation 1206 and operation 1208.

At operation 1210, if the decision is made that a debonding process is needed, the second wafer is then debonded and separated from the first wafer. The debonding process can be performed using the debonding system and methods disclosed in this application. A pair of separating blades with different thicknesses or flare angles and/or a pair of pulling heads with different pull forces can be utilized to facilitate the debonding process with fewer edge defects and/or reduced wafer breakage. At operation 1212, the debonded first wafer and second wafer are inspected for surface defects. At operation 1214, the first wafer and the second wafer may be replaced, cleaned, or re-polished. FIG. 8 illustrates some embodiments of a cross-sectional view 800 corresponding to operation 1210, 1212 and 1214.

At operation 1216, the second wafer is re-bonded to the first wafer. Then, a wafer bonding condition determination process, and following debonding and re-bonding process similar as described above may be repeated. FIG. 9 illustrates some embodiments of a cross-sectional view 900 corresponding to operation 1216.

Therefore, the present disclosure relates to wafer debonding system and method for to reduce edge defects and wafer breakage, and also to reduce debonding pull forces. By providing two pulling heads with different pulling forces and/or inserting the two separating blades with different thicknesses into an interface of the bonded wafers, unbalanced initial torques are provided on opposite sides to enhance debonding wave propagation and reduce debonding force. The lower pull force at a lower side can ensure that the lower side of the top wafer can be pulled up in order to prevent scratch at wafer edges.

In some embodiments, the present disclosure relates to a debonding apparatus. In some embodiments, the debonding apparatus comprises a wafer chuck configured to hold a pair of bonded substrates on a chuck top surface. The debonding apparatus further comprises a pair of separating blades including a first separating blade and a second separating blade placed at edges of the pair of bonded substrates. The first separating blade has a first thickness that is smaller than a second thickness of the second separating blade. The debonding apparatus further comprises a flex wafer assembly configured to pull the pair of bonded substrates upwardly to separate a second substrate from a first substrate of the pair of bonded substrate.

In other embodiments, the present disclosure relates to a debonding apparatus. In some embodiments, the debonding apparatus comprises a wafer chuck configured to hold a first substrate of the pair of bonded substrates. The debonding apparatus further comprises a pair of separating blades including a first separating blade and a second separating blade that are configured to be placed at edges of the pair of bonded substrates. The debonding apparatus further comprises a flex wafer assembly comprising a first pulling head and a second pulling head, wherein the first pulling head and the second pulling head are configured to be placed above the pair of bonded substrates and to hold and move a second substrate of the pair of bonded substrates separated from the first substrate.

In yet other embodiments, the present disclosure relates to a debonding apparatus for debonding a pair of bonded substrates. The debonding apparatus includes a wafer chuck configured to hold a first substrate of the pair of bonded substrates, and a pair of separating blades including a first separating blade and a second separating blade that are configured to be placed at edges of the pair of bonded substrates. The debonding apparatus also includes a flex wafer assembly comprising a first pulling head and a second pulling head. The first pulling head and the second pulling head are configured to hold and move a second substrate of the pair of bonded substrates separated from the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A debonding apparatus for debonding a pair of bonded substrates, comprising:
   a wafer chuck configured to hold the pair of bonded substrates on a chuck top surface;
   a pair of separating blades including a first separating blade and a second separating blade placed at edges of the pair of bonded substrates, wherein the first separating blade has a first thickness that is smaller than a second thickness of the second separating blade; and
   a flex wafer assembly configured to pull the pair of bonded substrates upwardly to separate a second substrate from a first substrate of the pair of bonded substrate.

2. The debonding apparatus of claim 1, wherein the pair of separating blades is located diametrically opposite to each other and is configured to facilitate the separating of the pair of bonded substrates by having the first separating blade inserted between the first substrate and the second substrate to a first distance and having the second separating blade inserted between the first substrate and the second substrate to a second distance.

3. The debonding apparatus of claim 2, wherein the second distance is equal to the first distance.

4. The debonding apparatus of claim 1, wherein the flex wafer assembly comprises a first pulling head and a second pulling head diametrically opposite to the first pulling head.

5. The debonding apparatus of claim 4, wherein the first pulling head is placed at a first side of the second substrate closer to the first separating blade and the second pulling head is placed at a second side of the second substrate closer to the second separating blade, wherein the first pulling head is configured to apply a first pull force and the second pulling head is configured to apply a second pull force greater than the first pull force.

6. The debonding apparatus of claim 4, wherein pull forces of the first pulling head and the second pulling head are controlled by a first coil spring and a second coil spring respectively coupled to the first pulling head and the second pulling head, and wherein a second spring coefficient of the second coil spring associated with the second pulling head is at least 10 times greater than that of a first spring coefficient of the first coil spring associated with the first pulling head.

7. The debonding apparatus of claim 1, wherein the first separating blade and the second separating blade respectively has a rounded front wedge.

8. The debonding apparatus of claim 1, wherein the first separating blade and the second separating blade respectively has a circular segment wedge that lines a circumference of the bonded substrates.

9. The debonding apparatus of claim 1, wherein the first separating blade and the second separating blade are made of polyetheretherketone material.

10. The debonding apparatus of claim 1, wherein a diameter of the wafer chuck is in a range of from about 0.5 to about 0.9 times of a diameter of the pair of bonded substrates.

11. A debonding apparatus for debonding a pair of bonded substrates, comprising:
    a wafer chuck configured to hold a first substrate of the pair of bonded substrates;
    a pair of separating blades including a first separating blade and a second separating blade that are configured to be placed at edges of the pair of bonded substrates; and
    a flex wafer assembly comprising a first pulling head and a second pulling head, wherein the first pulling head and the second pulling head are configured to be placed above the pair of bonded substrates and to hold and move a second substrate of the pair of bonded substrates separated from the first substrate.

12. The debonding apparatus of claim 11, wherein the first separating blade has a first thickness that is smaller than a second thickness of the second separating blade.

13. The debonding apparatus of claim 11, wherein the first separating blade is inserted between the first substrate and the second substrate to a first distance, and the second separating blade is inserted between the first substrate and the second substrate to a second distance that is equal to the first distance.

14. The debonding apparatus of claim 11, wherein the first pulling head is placed at a first side of the second substrate closer to the first separating blade and the second pulling head is placed at a second side of the second substrate closer to the second separating blade, wherein the first pulling head is configured to apply a first pull force and the second pulling head is configured to apply a second pull force greater than the first pull force.

15. The debonding apparatus of claim 11, wherein the first separating blade has a pointed end with a first flare angle smaller than a second flare angle of the second separating blade.

16. A debonding apparatus for debonding a pair of bonded substrates, comprising:
- a wafer chuck configured to hold a first substrate of the pair of bonded substrates;
- a pair of separating blades including a first separating blade and a second separating blade configured to be inserted between the first substrate and a second substrate of the pair of bonded substrate from edges of the pair of bonded substrates; and
- a flex wafer assembly comprising a first pulling head and a second pulling head, wherein the first pulling head and the second pulling head are configured to hold and pull the second substrate upward until the flex wafer assembly flexes the second substrate from the first substrate.

17. The debonding apparatus of claim 16, wherein the first separating blade is inserted between the first substrate and the second substrate to a first distance, and the second separating blade is inserted between the first substrate and the second substrate to a second distance that is equal to the first distance.

18. The debonding apparatus of claim 16, wherein the first pulling head is placed at a first side of the second substrate closer to the first separating blade and the second pulling head is placed at a second side of the second substrate closer to the second separating blade, wherein the first pulling head is configured to apply a first pull force and the second pulling head is configured to apply a second pull force greater than the first pull force.

19. The debonding apparatus of claim 16, wherein the flex wafer assembly has additional pulling heads placed on top surfaces of the second substrate for pulling up the second substrate.

20. The debonding apparatus of claim 19,
- wherein the pulling heads are distributed in a linear line that passes through a central axis of the second substrate and/or evenly spaced one from another; and
- wherein pulling forces provided by the pulling heads are linearly or parabolic increased one from another.

\* \* \* \* \*